(12) United States Patent
Xiao et al.

(10) Patent No.: US 10,586,731 B2
(45) Date of Patent: Mar. 10, 2020

(54) METHOD FOR MANUFACTURING SEMICONDUCTOR DEVICE THAT COMPRISES A FIN STRUCTURE

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Fang Yuan Xiao, Shanghai (CN); Jing Yong Huang, Shanghai (CN); Hai Yang Zhang, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 0 days.

(21) Appl. No.: 15/962,881

(22) Filed: Apr. 25, 2018

(65) Prior Publication Data
US 2018/0315643 A1 Nov. 1, 2018

(30) Foreign Application Priority Data
Apr. 26, 2017 (CN) .......................... 2017 1 0279660

(51) Int. Cl.
*H01L 21/762* (2006.01)
*H01L 29/66* (2006.01)
(Continued)

(52) U.S. Cl.
CPC ................. *H01L 21/76224* (2013.01); *H01L 21/823431* (2013.01); *H01L 21/823481* (2013.01);
(Continued)

(58) Field of Classification Search
CPC ......... H01L 21/76224; H01L 29/66795; H01L 29/0653; H01L 29/7851; H01L 29/785;
(Continued)

(56) References Cited

U.S. PATENT DOCUMENTS

2019/0157090 A1* 5/2019 Jang .................. H01L 21/32133

* cited by examiner

*Primary Examiner* — Niki H Nguyen
*Assistant Examiner* — Juanita B Rhodes
(74) *Attorney, Agent, or Firm* — Innovation Counsel LLP

(57) ABSTRACT

A semiconductor device manufacturing method is presented. The method entails providing a semiconductor structure comprising a substrate, one or more semiconductor fins on the substrate, and a trench isolation structure around each semiconductor fin, wherein the trench isolation structure comprises a first component intersecting an extension direction of the semiconductor fin and a second component parallel with the extension direction; etching the trench isolation structure to expose a portion of the semiconductor fin; forming a patterned buffer layer on the semiconductor structure covering the second component and having an opening exposing the first component; forming an insulation layer in the opening, with upper surfaces of the insulation layer and the semiconductor fin substantially on the same horizontal level; and removing the buffer layer. This inventive concept reduces, if not eliminates, oxide loss in Single Diffusion Break (SDB) region.

10 Claims, 13 Drawing Sheets

(51) Int. Cl.
  *H01L 29/78* (2006.01)
  *H01L 27/088* (2006.01)
  *H01L 21/8234* (2006.01)
  *H01L 29/06* (2006.01)
(52) U.S. Cl.
  CPC ...... *H01L 27/0886* (2013.01); *H01L 29/0653* (2013.01); *H01L 29/66795* (2013.01); *H01L 29/785* (2013.01); *H01L 29/7851* (2013.01)
(58) Field of Classification Search
  CPC ..... H01L 21/823431; H01L 21/823481; H01L 27/0886
  See application file for complete search history.

METHOD FOR MANUFACTURING SEMICONDUCTOR DEVICE THAT COMPRISES A FIN STRUCTURE

CROSS-REFERENCE TO RELATED APPLICATION

This application claims priority to and benefit of Chinese Patent Application No. 201710279660.1 filed on Apr. 26, 2017, which is incorporated herein by reference in its entirety.

BACKGROUND

(a) Field of the Invention

This inventive concept relates generally to semiconductor techniques, and more specifically, to a semiconductor device and its manufacturing method.

(b) Description of the Related Art

Fin Field Effect Transistor (FinFET) is an exceptional semiconductor structure that substantially reduces the size of semiconductor devices and has a potential to replace conventional planetary Complementary Metal Oxide Semiconductor (CMOS) structure. High circuit density in a chip mandates a short distance between neighboring semiconductor fins. However, in conventional techniques, a short inter-fin distance may cause bridging between a polycrystalline silicon pseudo gate and a source. FIG. 1A shows a schematic sectional view illustrating a conventional semiconductor device manufacturing method. The semiconductor device in FIG. 1A comprises a semiconductor fin 101, a trench isolation structure 103 between neighboring semiconductor fins, a silicon dioxide layer 102 in the trench isolation structure 103, a pseudo gate 104 on the silicon dioxide layer 102, and a hard mask layer 105 on the pseudo gate 104. A short distance between neighboring semiconductor fins (circled in FIG. 1A) may cause bridging between the pseudo gate 104 and a source region in the semiconductor fin 101, which deteriorates the performance of the semiconductor device.

In conventional methods, this problem may be partially mitigated by raising the silicon dioxide layer 102 in the trench isolation structure 103 and having the pseudo gate 104 formed on the raised silicon dioxide layer 102, as shown in FIG. 1B. This process is known as Single Diffusion Break (SDB) process and can be used in high-density chip design.

However, the inventors of this inventive concept discovered that in SDB processes, excessive silicon dioxide in the trench isolation structure may be etched and lost, which impairs the performance of the semiconductor device.

SUMMARY

The inventor of this inventive concept investigated the issues in conventional techniques and proposed an innovative solution that remedies at least some issues of the conventional methods.

This inventive concept first presents a semiconductor device manufacturing method, comprising:
providing a semiconductor structure comprising a substrate, one or more semiconductor fins on the substrate, and a trench isolation structure around each semiconductor fin, wherein upper surfaces of the trench isolation structure and the semiconductor fin are substantially on the same horizontal level, and the trench isolation structure comprises a first component intersecting an extension direction of the semiconductor fin and a second component parallel with the extension direction of the semiconductor fin;
etching the trench isolation structure to expose a portion of the semiconductor fin;
forming a patterned buffer layer on the semiconductor structure covering the second component of the trench isolation structure, wherein the patterned buffer layer has an opening exposing the first component of the trench isolation structure;
forming an insulation layer in the opening, with an upper surface of the insulation layer and the upper surface of the semiconductor fin substantially on the same horizontal level; and
removing the buffer layer.

Additionally, in the aforementioned method, forming an insulation layer in the opening may comprise:
forming an insulation layer on the semiconductor structure filling the opening after the buffer layer has been formed; and
conducting an etch-back process on the insulation layer so that the upper surfaces of the insulation layer and the semiconductor fin are substantially on the same horizontal level.

Additionally, in the aforementioned method, when conducting an etch-back process on the insulation layer, a portion of the buffer layer may also be removed, so that an upper surface of the remaining buffer layer is either higher than, or substantially on the same horizontal level with, the upper surface of the semiconductor fin.

Additionally, in the aforementioned method, the insulation layer may be formed by a deposition process, a temperature of the deposition process may be in a range of 200° C. to 400° C., and the etch-back process may be a fluorine-based plasma treatment.

Additionally, in the aforementioned method, forming a patterned buffer layer on the semiconductor structure may comprise:
forming a buffer layer covering the semiconductor structure;
forming a patterned mask layer on the buffer layer;
etching the buffer layer using the patterned mask layer as a mask to form an opening in the buffer layer exposing the first component of the trench isolation structure; and
removing the patterned mask layer.

Additionally, in the aforementioned method, the buffer layer may be made of a carbonaceous material, the insulation layer may be made of a silicon-based oxide, the buffer layer may be etched by an etching process based on sulfur dioxide and oxygen to form the opening, and the width the opening may be larger than the width of the first component of the trench isolation structure.

Additionally, in the aforementioned method, when etching the buffer layer to form an opening, a portion of the semiconductor fin neighboring the first component of the trench isolation structure may also be removed to form a notch at the edge of the semiconductor fin, and when forming the insulation layer, the insulation layer may also fill the notch.

This inventive concept further presents a semiconductor device, comprising:
a substrate;
one or more semiconductor fins on the substrate;
a trench isolation structure around each semiconductor fin exposing a portion of the semiconductor fin, wherein the trench isolation structure comprises a first component intersecting an extension direction of the semiconductor fin and a second component parallel with the extension direction of the semiconductor fin;

a patterned buffer layer on the trench isolation structure covering the second component of the trench isolation structure, wherein the patterned buffer layer has an opening exposing the first component of the trench isolation structure; and an insulation layer in the opening, with upper surfaces of the insulation layer and the semiconductor fin substantially on the same horizontal level.

Additionally, in the aforementioned device, an upper surface of the buffer layer may be higher than, or substantially on the same horizontal level with, the upper surface of semiconductor fin, the buffer layer may be made of a carbonaceous material, the insulation layer may be made of a silicon-based oxide, and the width of the opening may be larger than the width of the first component of the trench isolation structure.

Additionally, the aforementioned device may further comprise a notch formed at the edge of the semiconductor fin neighboring the first component of the trench isolation structure, with the insulation layer filling the notch.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

DETAILED DESCRIPTION OF THE EMBODIMENTS

Figure 1A:
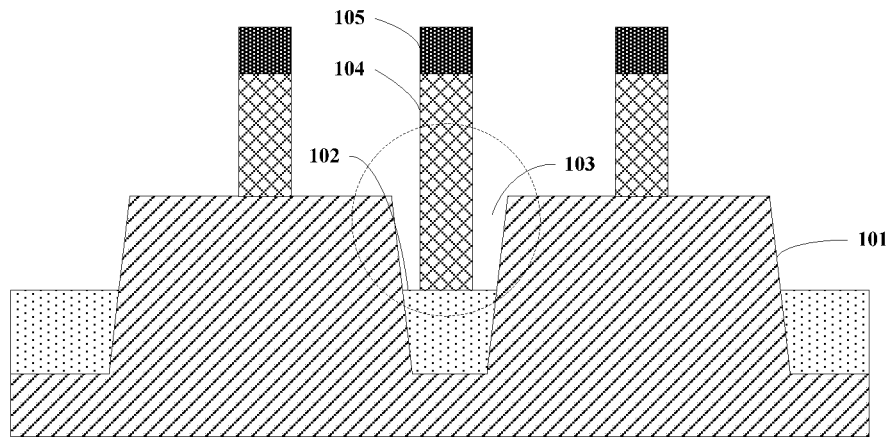
FIG. 1A shows a schematic sectional view illustrating a conventional semiconductor device manufacturing method.
Figure 1B:
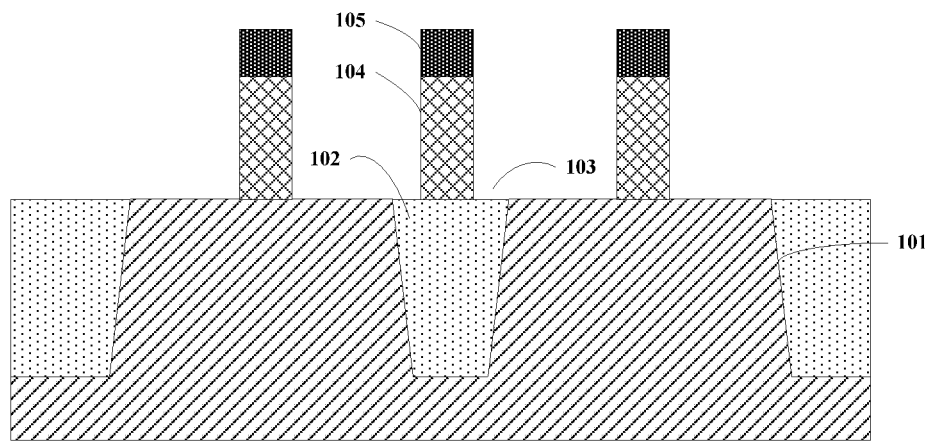
FIG. 1B shows a schematic sectional view illustrating another conventional semiconductor device manufacturing method.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first,"

"second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

FIGS. 2A, 2B, 3A, 3B, 4A, 4B, 5A, 5B, 6A, and 6B show schematic sectional views illustrating different stages of a conventional semiconductor device manufacturing method. These drawings also illustrate the Single Diffusion Break (SDB) process in conventional semiconductor device manufacturing methods. A conventional semiconductor device manufacturing method is described below in reference to these drawings.

Figure 2A:
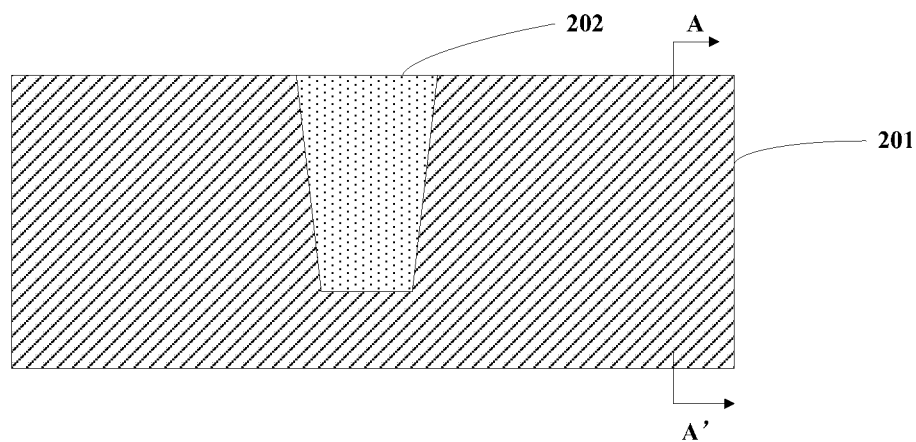
FIG. 2A shows a schematic sectional view illustrating one stage of a conventional semiconductor device manufacturing method.
Figure 2B:
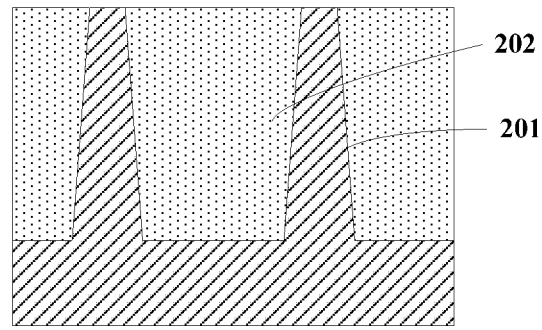
FIG. 2B shows a schematic sectional view of the structure in FIG. 2A, observed along a direction A-A' of FIG. 2A.

First, referring to FIGS. 2A and 2B, an initial structure is provided, the initial structure comprises semiconductor fins 201 and a silicon dioxide layer 202 between neighboring semiconductor fins 201.

Figure 3A:
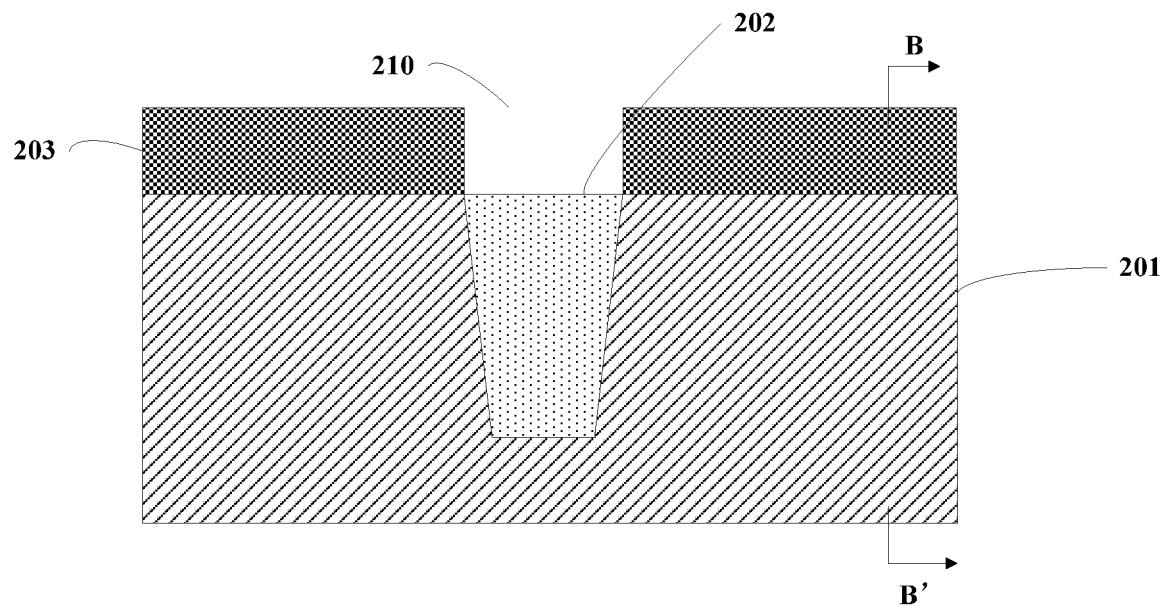
FIG. 3A shows a schematic sectional view illustrating one stage of a conventional semiconductor device manufacturing method.
Figure 3B:
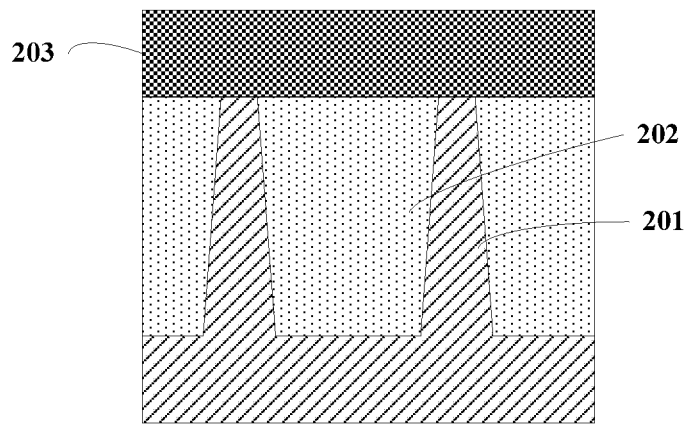
FIG. 3B shows a schematic sectional view of the structure in FIG. 3A, observed along a direction B-B' of FIG. 3A.

Next, referring to FIGS. 3A and 3B, a patterned silicon nitride layer 203 is formed on the initial structure, wherein the silicon nitride layer 203 has an opening 210 exposing a portion of the silicon dioxide layer 202.

Figure 4A:
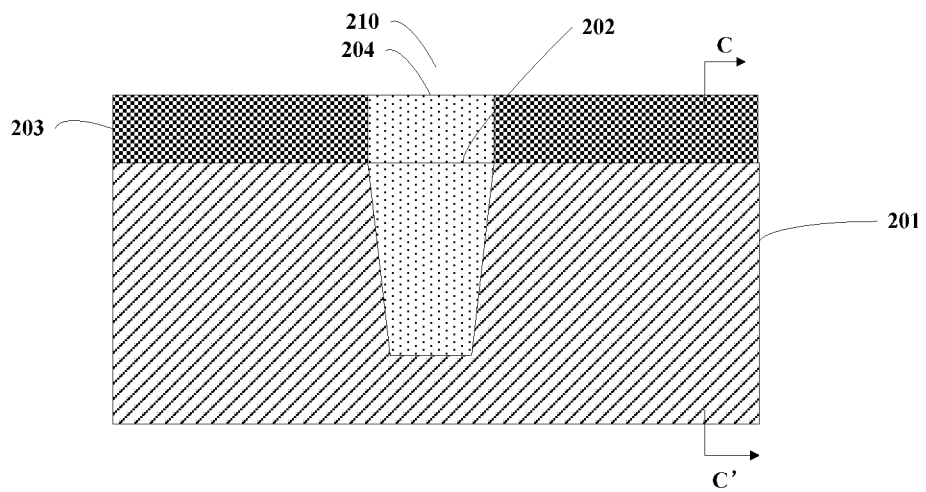
FIG. 4A shows a schematic sectional view illustrating one stage of a conventional semiconductor device manufacturing method.
Figure 4B:
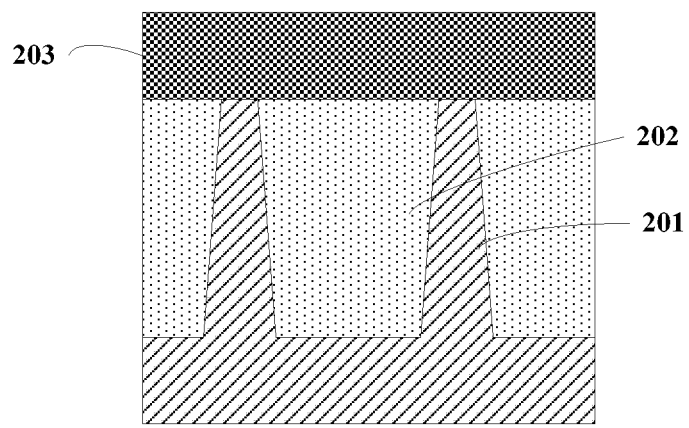
FIG. 4B shows a schematic sectional view of the structure in FIG. 4A, observed along a direction C-C' of FIG. 4A.

Next, referring to FIGS. 4A and 4B, a silicon oxide layer 204 is formed in the opening 210.

Figure 5A:
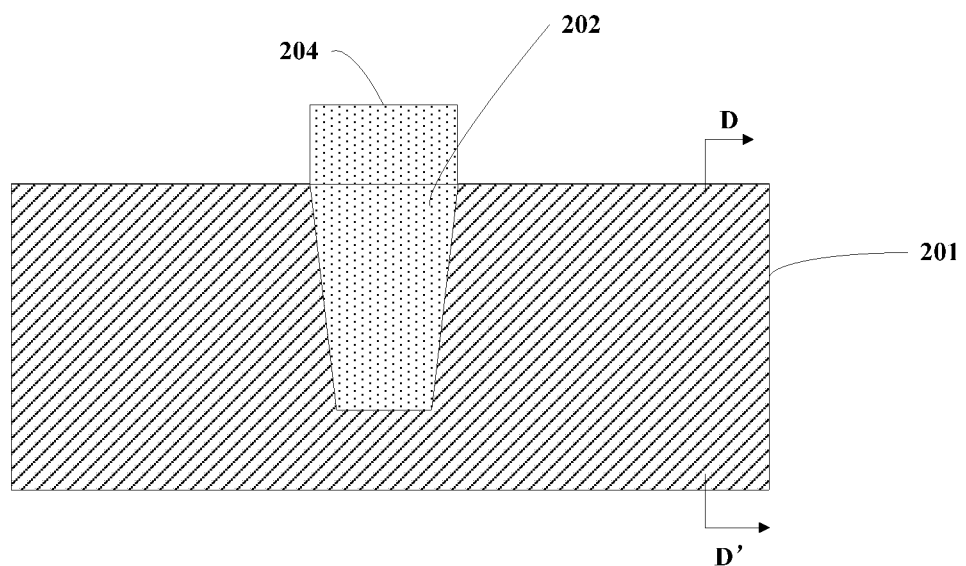
FIG. 5A shows a schematic sectional view illustrating one stage of a conventional semiconductor device manufacturing method.
Figure 5B:
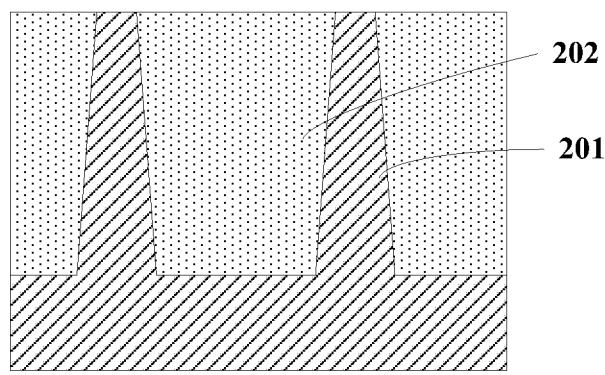
FIG. 5B shows a schematic sectional view of the structure in FIG. 5A, observed along a direction D-D' of FIG. 5A.

Next, referring to FIGS. 5A and 5B, the silicon nitride layer 203 is removed.

Figure 6A:
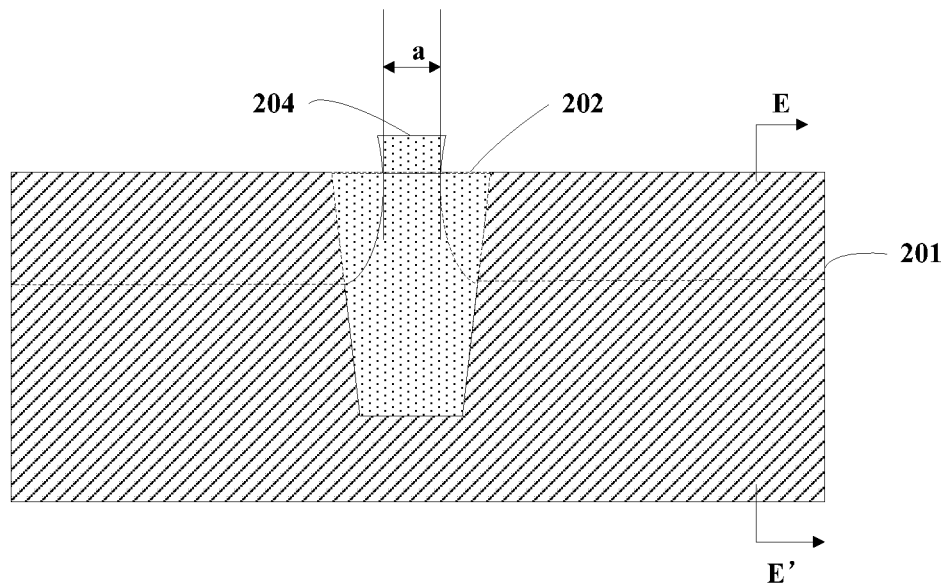
FIG. 6A shows a schematic sectional view illustrating one stage of a conventional semiconductor device manufacturing method.
Figure 6B:
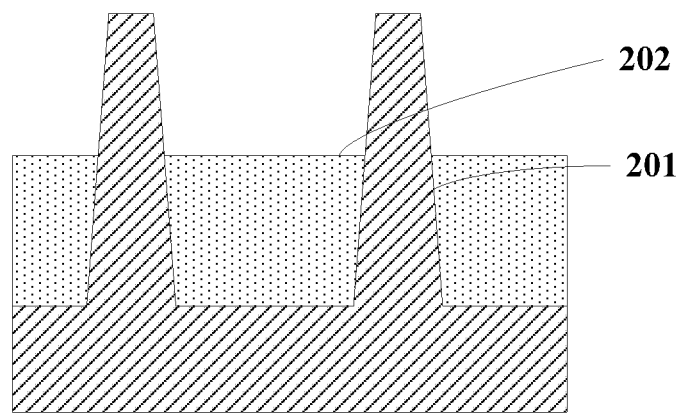
FIG. 6B shows a schematic sectional view of the structure in FIG. 6A, observed along a direction E-E' of FIG. 6A.

Next, referring to FIGS. 6A and 6B, through an isotropic plasma etching process, a depression process is applied on the silicon oxide layer 204 and the silicon dioxide layer 202 to form a trench isolation structure of an SDB region. The dash lines in FIG. 6A mark the position of an upper surface of the silicon dioxide layer 202 as shown in FIG. 6B. In the depression process, the isotropic plasma etching process may cause oxide lost in the SDB region, which may impair the performance of the device. For example, as shown in FIG. 6A, oxide in the SDB region might have a thickness of only 12 nm ("a" in FIG. 6A), which may result in suboptimal reliability of the device.

Figure 7:
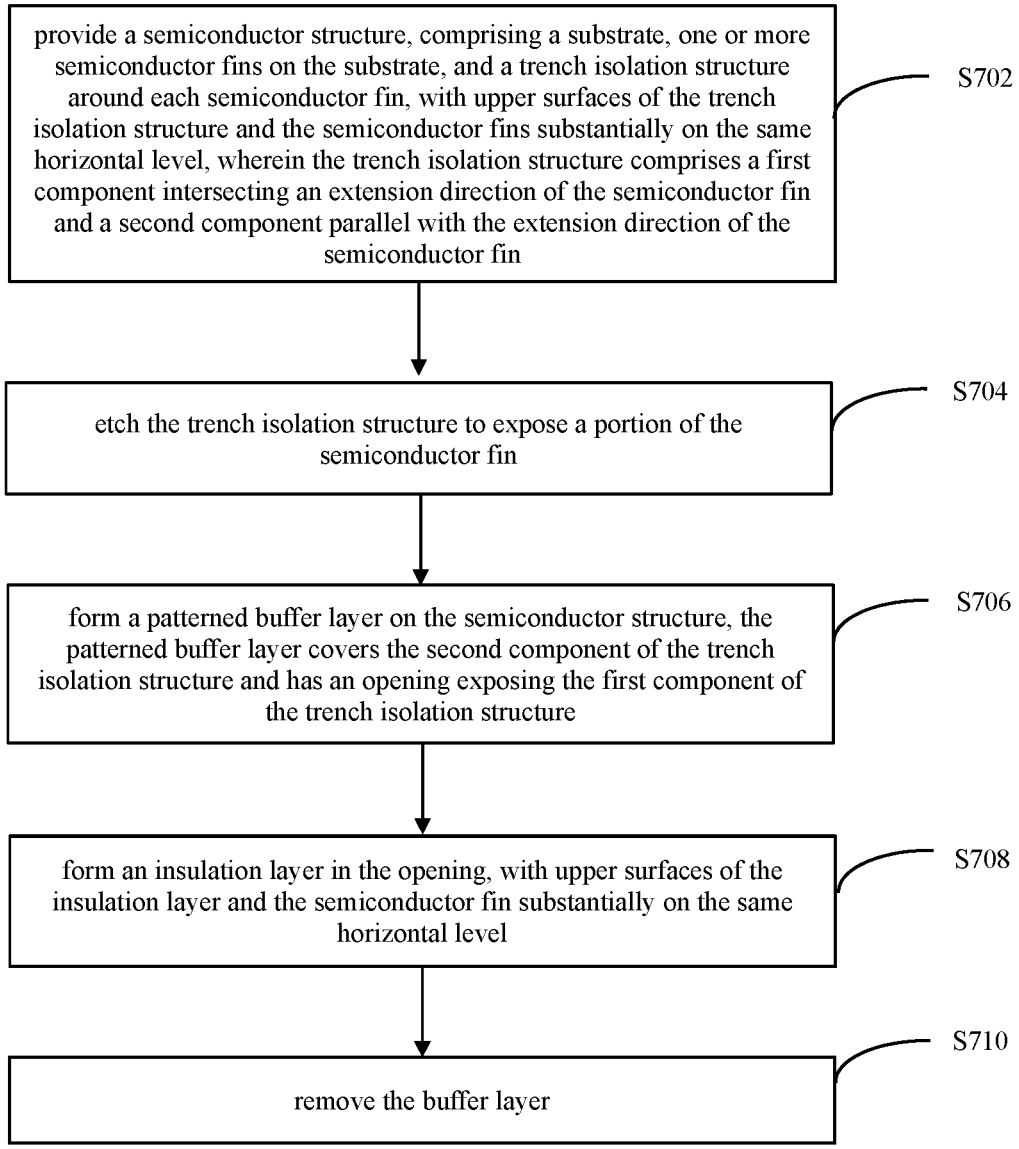
FIG. 7 shows a flowchart illustrating a semiconductor device manufacturing method in accordance with one or more embodiments of this inventive concept.

FIG. 7 shows a flowchart illustrating a semiconductor device manufacturing method in accordance with one or more embodiments of this inventive concept.

In step S702, a semiconductor structure is provided, the semiconductor structure comprises a substrate, one or more semiconductor fins on the substrate, and a trench isolation structure around each semiconductor fin. Upper surfaces of the semiconductor fins and the trench isolation structure are substantially on the same horizontal level. The trench isolation structure comprises a first component intersecting with an extension direction of the semiconductor fin and a second component parallel with the extension direction of the semiconductor fin.

It should be understood that in this description, two horizontal surfaces may be considered "substantially on the same horizontal level" as long as their vertical positions are within a certain tolerance range, it does not require these two surfaces exactly coincide with each other. For example, the upper surfaces of the trench isolation structure and the semiconductor fins may be considered "substantially on the same horizontal level" even if one is slightly higher or slightly lower than the other.

In step S704, the trench isolation structure is etched to expose a portion of the semiconductor fin.

In step S706, a patterned buffer layer is formed on the semiconductor structure after the trench isolation structure is etched, the buffer layer covers the second component of the trench isolation structure and has an opening exposing the first component of the trench isolation structure.

Optionally, step S706 may further comprise: forming a buffer layer covering the semiconductor structure. The buffer layer may be made of a carbonaceous material. For example, the buffer layer may be made of Spin-On Carbon (SOC), a carbonaceous material plated on the semiconductor structure by spin coating.

Optionally, step S706 may further comprise forming a patterned mask layer on the buffer layer, the patterned mask layer may be a photoresist.

Optionally, step S706 may further comprise etching the buffer layer using the patterned mask layer as a mask to form an opening in the buffer layer exposing the first component of the trench isolation structure.

Optionally, step S706 may further comprise removing the mask layer.

In step S708, an insulation layer is formed in the opening, with upper surfaces of the insulation layer and the semiconductor fins substantially on the same horizontal level. For example, the insulation layer may be made of a silicon-based oxide such as silicon dioxide.

Optionally, step S708 may further comprise forming an insulation layer filling the opening on the semiconductor structure after the buffer layer has been formed on the semiconductor structure.

Optionally, step S708 may further comprise conducting an etch-back process on the insulation layer so that upper surfaces of the insulation layer and the semiconductor fins are substantially on the same horizontal level.

In step S710, the buffer layer is removed.

A semiconductor device manufacturing method in accordance with one or more embodiments of this inventive concept is described above. In this manufacturing method, a patterned buffer layer is formed on the trench isolation structure after a depression process is applied on the trench isolation structure, then an insulation layer in the SDB region is formed through an opening in the buffer layer before the buffer layer is eventually removed. This manufacturing method reduces, if not eliminates, oxide loss in the SDB region.

Figure 8A:
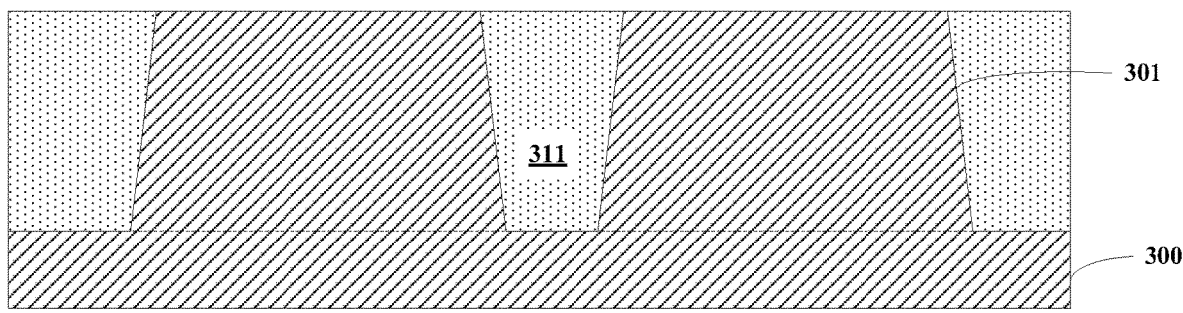
FIG. 8A shows a schematic sectional view illustrating one stage of a semiconductor device manufacturing method in accordance with one or more embodiments of this inventive concept, observed along an extension direction of a semiconductor fin.
Figure 8B:
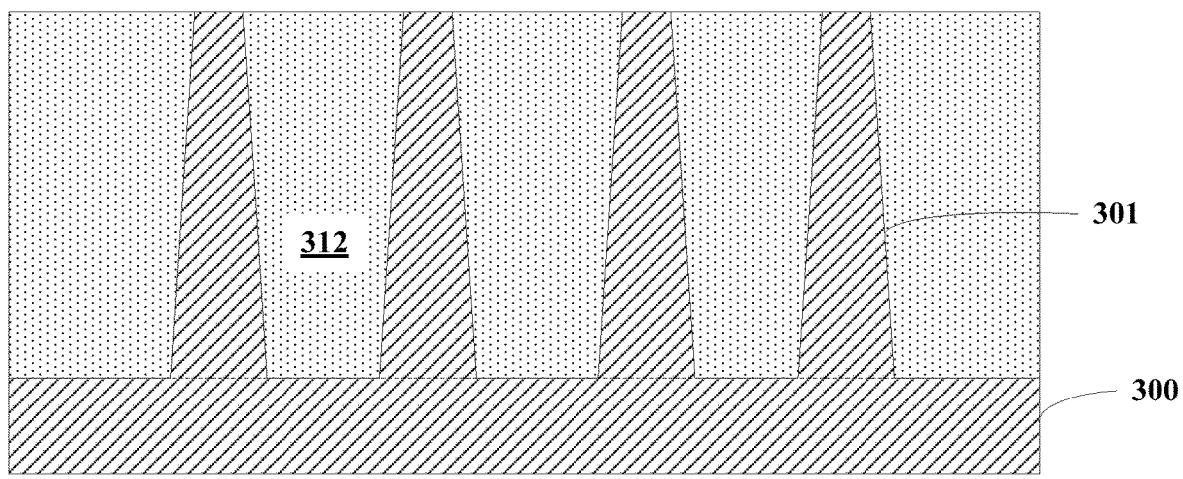
FIG. 8B shows a schematic sectional view illustrating one stage of a semiconductor device manufacturing method in accordance with one or more embodiments of this inventive concept, observed along a direction perpendicular to an extension direction of a semiconductor fin.
Figure 8C:
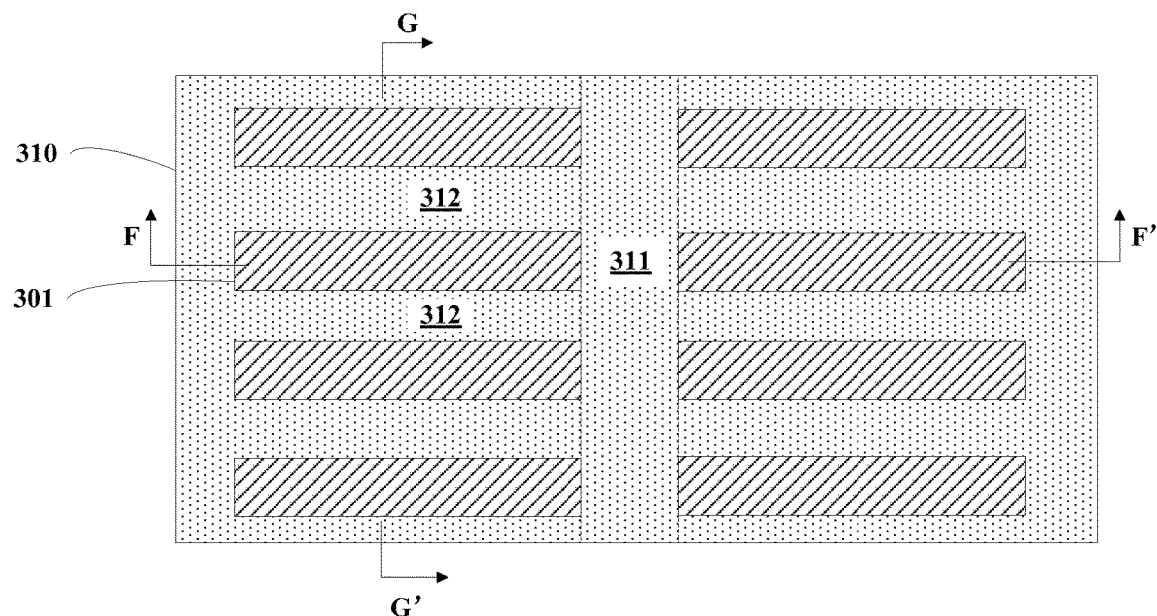
FIG. 8C shows a top plan view illustrating one stage of a semiconductor device manufacturing method in accordance with one or more embodiments of this inventive concept.

FIGS. 8A, 8B, 9A, 9B, 10A, 10B, 11A, 11B, 12A, 12B, 13A, 13B, 14A, and 14B show schematic sectional views illustrating different stages of a semiconductor device manufacturing method in accordance with one or more embodiments of this inventive concept. FIG. 8C shows a top plan view illustrating one stage of a semiconductor device manufacturing method in accordance with one or more embodiments of this inventive concept, FIG. 8A shows a schematic sectional view of the structure in FIG. 8C, observed along a direction F-F' of FIG. 8C, and FIG. 8B shows a schematic sectional view of the structure in FIG. 8C, observed along a direction G-G' of FIG. 8C. A semiconductor device manufacturing method in accordance with one or more embodiments of this inventive concept is described below with reference to these drawings.

First, referring to FIGS. 8A, 8B, and 8C, a semiconductor structure is provided. The semiconductor structure comprises a substrate (e.g., a silicon substrate) 300, one or more semiconductor fins 301 on the substrate 300, and a trench isolation structure 310 around each semiconductor fin 301. Referring to FIGS. 8A and 8B, upper surfaces of the trench isolation structure 310 and the semiconductor fins 301 are substantially on the same horizontal level. The trench isolation structure 310 may further comprise a first component 311 intersecting with an extension direction of the semiconductor fin 301, and a second component 312 parallel with the extension direction of the semiconductor fin 301. For example, the trench isolation structure 310 may be a Shallow Trench Isolation (STI). The first component 311 may comprise a first trench intersecting an extension direction of semiconductor fin 301, and a first trench isolation material layer (which may be made of silicon dioxide) filling the first trench. The second component 312 may comprise a second trench parallel with the extension direction of the semiconductor fin 301, and a second trench isolation material layer (which may be made of silicon dioxide) filling the second trench.

It should be understood that the dash lines in FIGS. 8A, 8B and all other drawings in this application are for illustration purpose only and do not represent any actual structural component.

For example, providing a semiconductor structure may comprise forming a patterned hard mask layer (which may be made of silicon nitride) on the substrate 300. Optionally, providing a semiconductor structure may further comprise: etching the substrate using the hard mask layer as a mask to form one or more semiconductor fins, with a trench isolation structure formed around each semiconductor fin; depositing a trench isolation material layer filling the trench isolation structure; conducting a planarization process (such as a Chemical Mechanical Polishing (CMP) process) on the trench isolation material layer to expose an upper surface of the hard mask layer; removing the hard mask layer using, for example, hot phosphoric acid; and etching the trench isolation material layer to expose an upper surface of the semiconductor fin, with the upper surfaces of the trench isolation material layer and the semiconductor fin substantially on the same horizontal level.

Figure 9A:
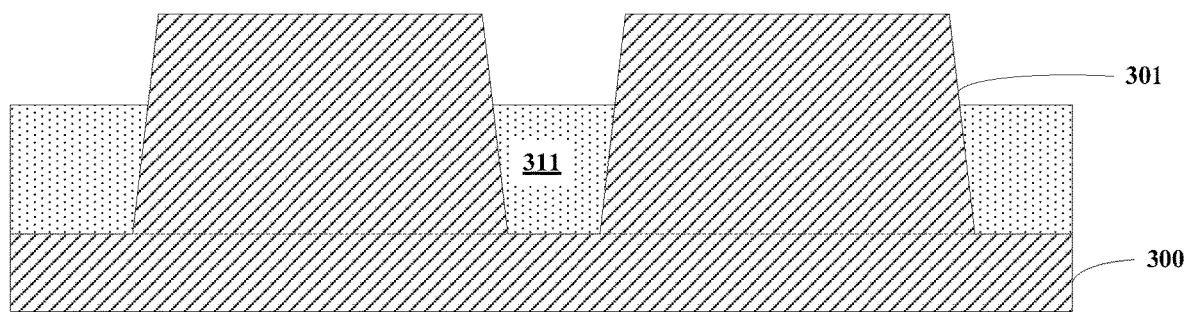
FIGS. 9A, 10A, 11A, 12A, 13A, and 14A show additional schematic sectional views illustrating different stages of a semiconductor device manufacturing method in accordance with one or more embodiments of this inventive concept, observed along an extension direction of a semiconductor fin.
Figure 9B:
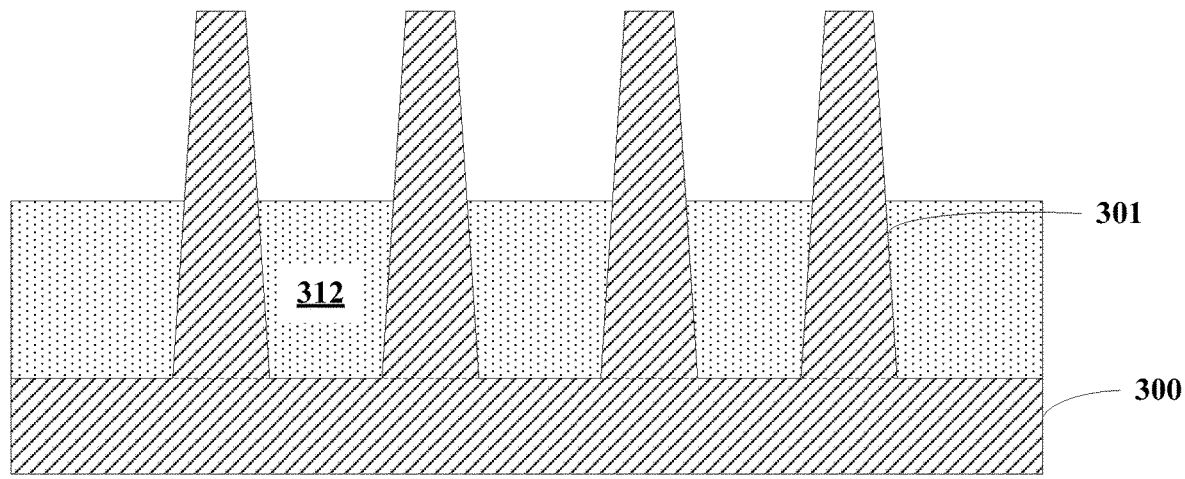
FIGS. 9B, 10B, 11B, 12B, 13B, and 14B show additional schematic sectional views illustrating different stages of a semiconductor device manufacturing method in accordance with one or more embodiments of this inventive concept, observed along a direction perpendicular to an extension direction of a semiconductor fin.

Next, referring to FIGS. 9A and 9B, through a depression process, the trench isolation structure 310 is etched to expose a portion of the semiconductor fin 301. For example, the first component 311 and the second component 312 of the trench isolation structure 310 may be etched using a SiCoNi machine, which can effectively remove silicon oxide while retaining silicon through a chemical etching process, to expose a portion of the semiconductor fins 301.

Figure 10A:
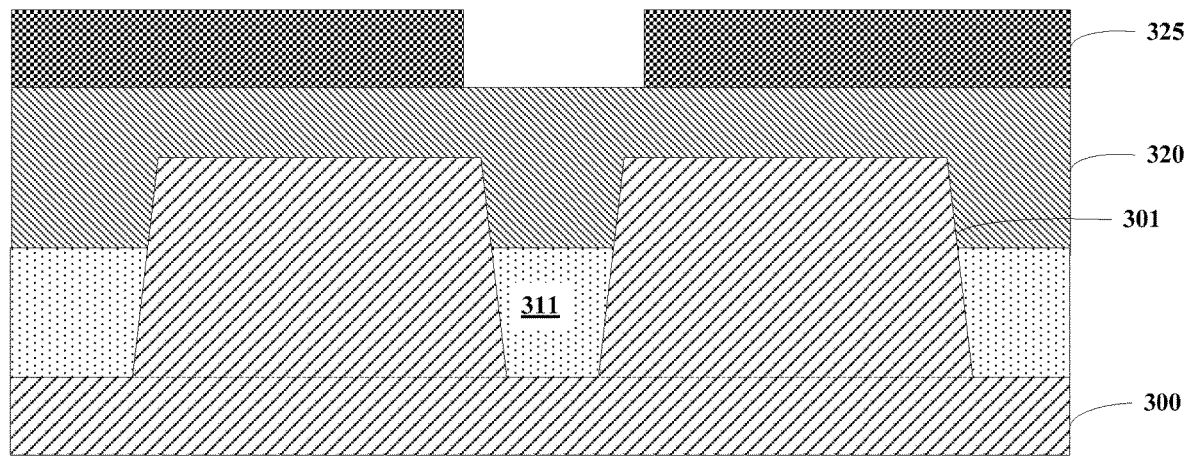
Figure 10B:
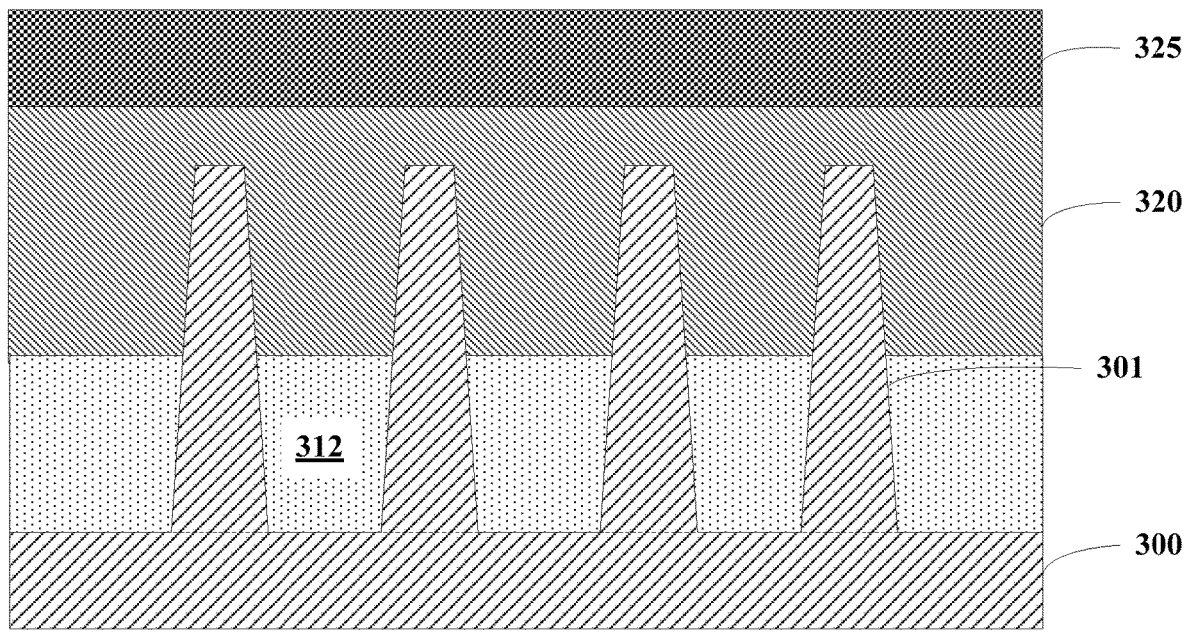

Next, referring to FIGS. 10A and 10B, a buffer layer 320 covering the semiconductor structure is formed, and then a patterned mask layer 325 is formed on the buffer layer 320. The buffer layer 320 may be made of Spin-On Carbon (SOC) and the mask layer 325 may be a photoresist.

Figure 11A:
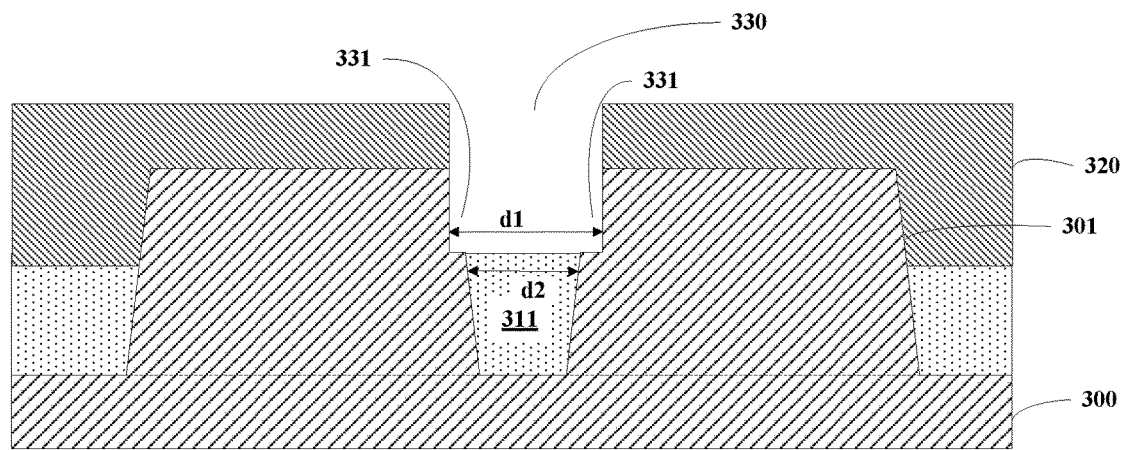
Figure 11B:
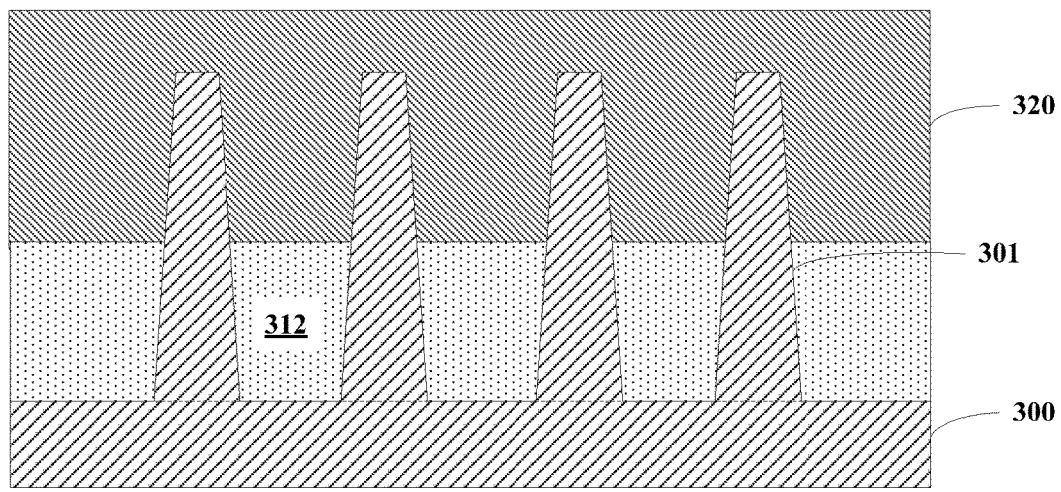

Next, referring to FIGS. 11A and 11B, the buffer layer 320 is etched using the patterned mask layer 325 as a mask to form an opening 330 in the buffer layer 320, with the opening 330 exposing the first component 311. Then the patterned mask layer 325 is removed. For example, an etching process based on sulfur dioxide and oxygen may be used to etch the buffer 320 to form the opening 330.

Referring to FIG. 11A, the width of the opening 330 ("d1" in FIG. 11A) may be larger than the width of the first component 311 ("d2" in FIG. 11A). Therefore when the buffer layer 320 is etched to form the opening 330, a portion of the semiconductor fin 301 neighboring the first component 311 may also be removed, and a notch 331 may be formed at the edge of the semiconductor fin 301. The notch 311 widens the opening 330 and facilitates the forming of an insulation layer filling the opening 330 in a succeeding stage. Additionally, the notch 311 at the edge of the semiconductor fin 301 increases the distance between the semiconductor fin 301 and a pseudo gate that will be formed on the insulation layer, and thus lowers the chance of their bridging.

Figure 12A:
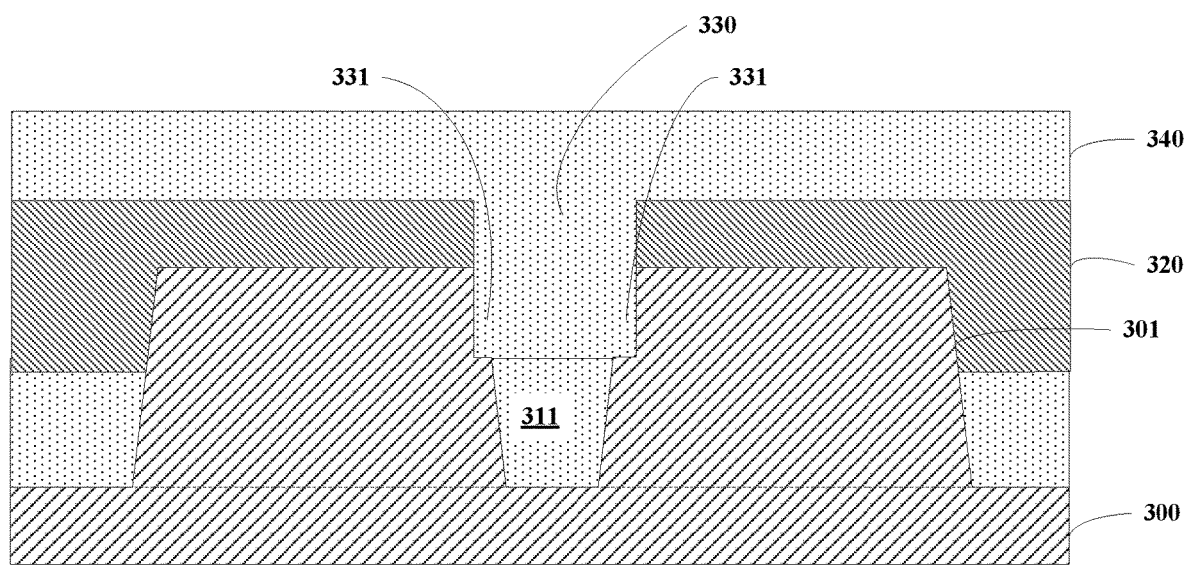
Figure 12B:
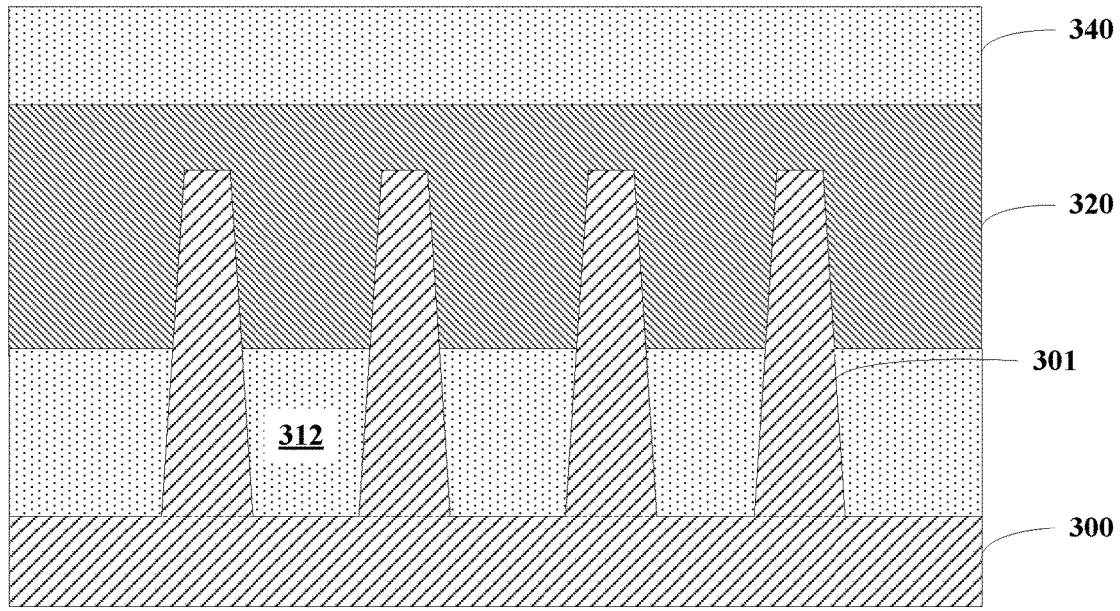

Next, referring to FIGS. 12A and 12B, after the buffer layer 320 is formed, an insulation layer (which may be made of silicon dioxide) 340 filling the opening 330 and the notch 331 is formed on the semiconductor structure. In one embodiment, the insulation layer 340 may be formed by a deposition process (such as Atomic Layer Deposition (ALD), High Density Plasma Chemical Vapor Deposition (HDPCVD), or Low Temperature Deposition (LTD)), and the temperature of the deposition process may be in a range of 200° C. to 400° C. (e.g., 250° C., 300° C., or 350° C.).

Figure 13A:
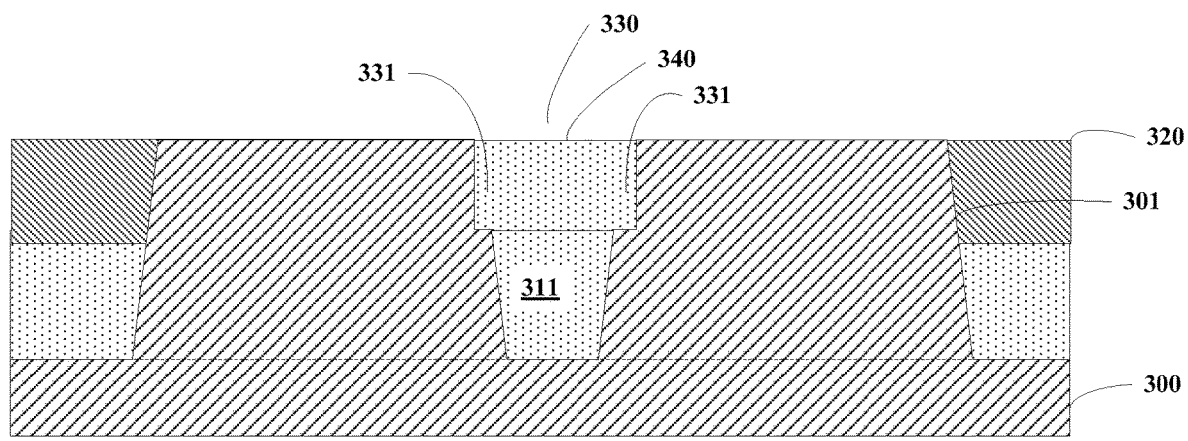
Figure 13B:
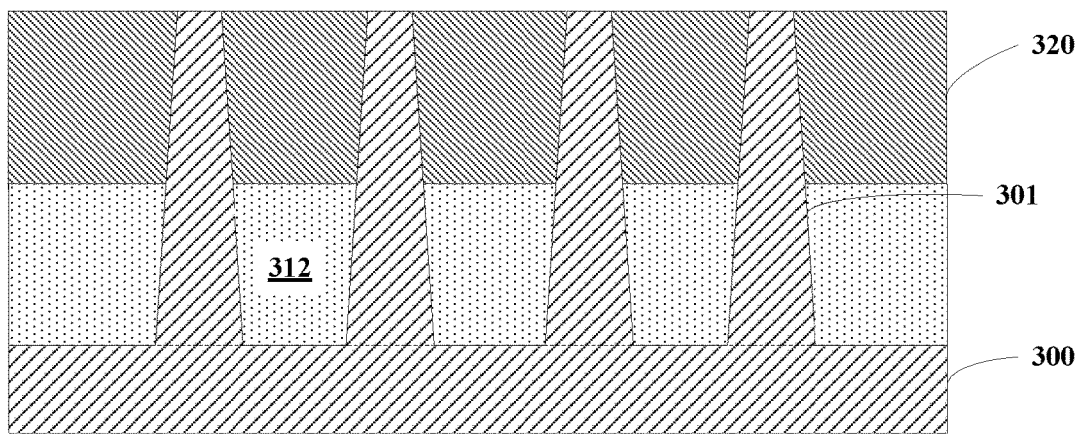

Next, referring to FIGS. 13A and 13B, an etch-back process is conducted on the insulation layer 340 so that upper surfaces of the remaining the insulation layer 340 and the semiconductor fin 301 are substantially on the same horizontal level. The etch-back process may be a fluorine-based plasma treatment.

Optionally, in the etch-back process, a portion of the buffer layer 320 may also be removed (that is, both the insulation layer 340 and the buffer layer 320 are etched back), so that the upper surface of the buffer layer 320 is either higher than, or substantially on the same horizontal level with, the upper surface of of the semiconductor fin 301.

Figure 14A:
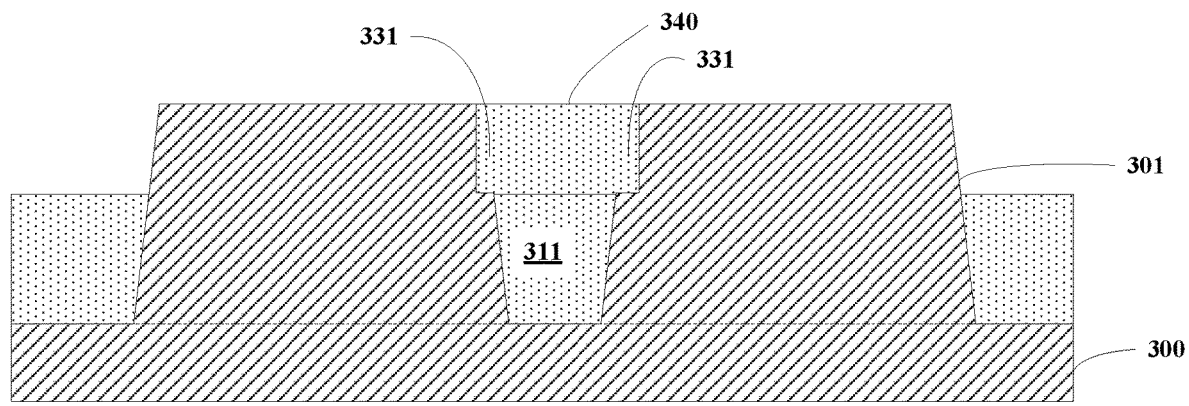
Figure 14B:
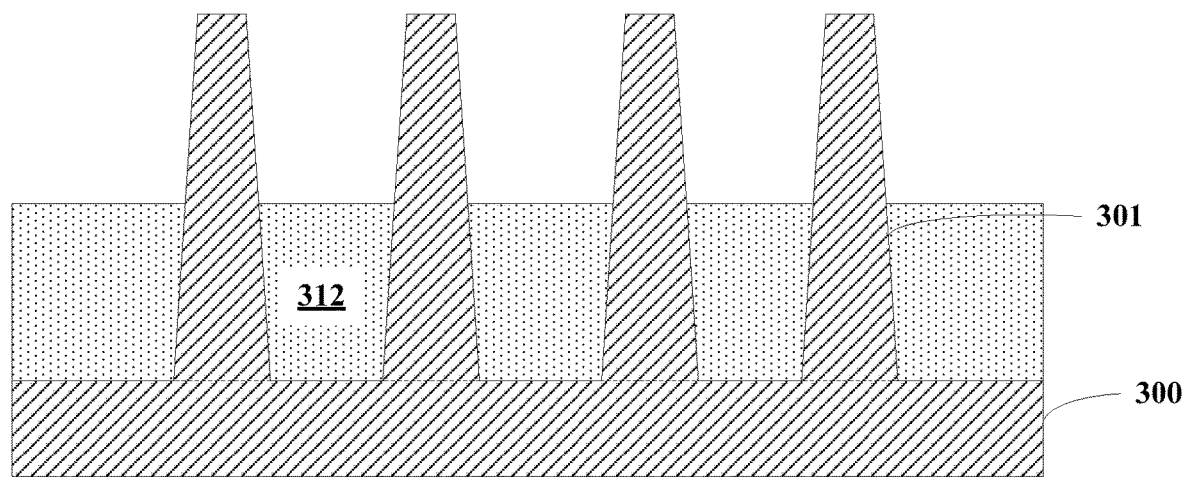

Next, referring to FIGS. 14A and 14B, the buffer layer 320 is removed by, for example, a Mattson machine or a Gamma machine.

In this embodiment, the manufacturing method may further comprise forming a pseudo gate (not shown in the drawings) on the insulation layer 340.

This concludes the description of a semiconductor device manufacturing method in accordance with one or more embodiments of this inventive concept. In this manufacturing method, a patterned buffer layer is formed on the trench isolation structure after the trench isolation structure went through a depression process, and an insulation layer is formed in the SDB region through an opening in the buffer layer before the buffer layer is eventually removed. This manufacturing method reduces, if not eliminates, oxide loss in the SDB region.

In this manufacturing method, the width of the opening in the buffer layer is larger than the width of the first trench isolation structure, which facilitates the forming of an insulation layer filling the opening. Additionally, a notch is formed at the edge of the semiconductor fin and is covered by the insulation layer, the notch increases the distance between the semiconductor fin 301 and a pseudo gate formed on the insulation layer, and thus lowers the chance of their bridging.

This inventive concept further presents a semiconductor device. Referring to FIGS. 13A and 13B, the semiconductor device comprises a substrate 300 and one or more semiconductor fins 301 on the substrate 300. The semiconductor device may further comprise a trench isolation structure around each semiconductor fin 301, with the trench isolation structure exposing a portion of the semiconductor fins 301. The trench isolation structure may comprise a first component 311 intersecting an extension direction of the semiconductor fin 301 and a second component 312 parallel with the extension direction of the semiconductor fin 301. The semiconductor device may further comprise a patterned buffer layer 320 on the trench isolation structure covering the second component 312 of the trench isolation structure, wherein the buffer layer 320 has an opening 330 exposing the first component 311 of the trench isolation structure. The semiconductor device may further comprise an insulation layer 340 in the opening 330, with upper surfaces of the insulation layer 340 and the semiconductor fin 301 substantially on the same horizontal level.

In this semiconductor device, an SDB region may be formed between neighboring semiconductor fins 301 after the buffer layer 320 is removed. Thus oxide loss in the SDB region can be reduced, if not eliminated, compared to conventional methods.

In one embodiment, an upper surface of the buffer layer 320 may be either higher than, or substantially on the same horizontal level with, an upper surface of the semiconductor fin 301.

In one embodiment, the buffer layer 320 may be made of a carbonaceous material, and the insulation layer 340 may be made of a silicon-based oxide, such as silicon dioxide.

In one embodiment, the width of the opening 330 may be larger than the width of the first component 311 of the trench isolation structure.

In one embodiment, a notch 331 may be formed at the edge of the semiconductor fin 301 neighboring the first component 311, with the insulation layer 340 filling the notch 331. The notch 331 increases the distance between the edge of the semiconductor fin 301 and a pseudo gate that will be formed on the insulation layer 340, and thus lowers the chance of their bridging.

This concludes the description of a semiconductor device and its manufacturing method in accordance with one or more embodiments of this inventive concept. For purposes of conciseness and convenience, some components or procedures that are well known to one of ordinary skills in the art in this field are omitted. These omissions, however, do not prevent one of ordinary skill in the art in this field to make and use the inventive concept herein disclosed.

While this inventive concept has been described in terms of several embodiments, there are alterations, permutations, and equivalents, which fall within the scope of this disclosure. It shall also be noted that there are alternative ways of implementing the methods and/or apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. A method for manufacturing a semiconductor device, the method comprising:
providing a semiconductor structure comprising a substrate, one or more semiconductor fins on the substrate, and a trench isolation structure around each semiconductor fin, wherein upper surfaces of the trench isolation structure and the semiconductor fin are substantially on a same horizontal level, and the trench isolation structure comprises a first component intersecting an extension direction of the semiconductor fin and a second component parallel to the extension direction of the semiconductor fin;
etching the trench isolation structure to expose a portion of the semiconductor fin;
forming a patterned buffer layer on the semiconductor structure covering the second component of the trench isolation structure, wherein the patterned buffer layer has an opening exposing the first component of the trench isolation structure;
forming an insulation layer in the opening, with an upper surface of the insulation layer and the upper surface of the semiconductor fin substantially on the same horizontal level; and
removing the patterned buffer layer.

2. The method of claim 1, wherein forming the insulation layer in the opening comprises:
   forming an insulation material layer on the semiconductor structure filling the opening after the patterned buffer layer has been formed; and
   conducting an etch-back process on the insulation material layer to form the insulation layer.

3. The method of claim 2, wherein when conducting the etch-back process on the insulation material layer, a portion of the patterned buffer layer is removed to form a remaining buffer layer, wherein an upper surface of the remaining buffer layer is either higher than or substantially on the same horizontal level with the upper surface of the semiconductor fin.

4. The method of claim 2, wherein the insulation layer is formed by a deposition process, and a temperature of the deposition process is in a range of 200° C. to 400° C.

5. The method of claim 2, wherein the etch-back process is a fluorine-based plasma treatment.

6. The method of claim 1, wherein forming the patterned buffer layer on the semiconductor structure comprises:
   forming a buffer layer covering the semiconductor structure;
   forming a patterned mask layer on the buffer layer;
   etching the buffer layer using the patterned mask layer as a mask to form the opening in the patterned buffer layer; and
   removing the patterned mask layer.

7. The method of claim 6, wherein the buffer layer is made of a carbonaceous material, and the insulation layer is made of a silicon-based oxide.

8. The method of claim 6, wherein the buffer layer is etched by an etching process based on sulfur dioxide and oxygen to form the opening.

9. The method of claim 6, wherein a width the opening is larger than a width of the first component of the trench isolation structure.

10. The method of claim 9, wherein when etching the buffer layer to form the opening, a portion of the semiconductor fin neighboring the first component of the trench isolation structure is also removed to form a notch at an edge of the semiconductor fin, and when forming the insulation layer, the insulation layer also fills the notch.

* * * * *